(12) United States Patent
Sommer

(10) Patent No.: US 9,461,182 B2
(45) Date of Patent: Oct. 4, 2016

(54) MEMORY CELL

(75) Inventor: Michael Sommer, Raubling (DE)

(73) Assignee: Infineon Technologies AG, Neubiberg (DE)

( * ) Notice: Subject to any disclaimer, the term of this patent is extended or adjusted under 35 U.S.C. 154(b) by 1209 days.

(21) Appl. No.: 11/745,098

(22) Filed: May 7, 2007

(65) Prior Publication Data

US 2008/0277711 A1 Nov. 13, 2008

(51) Int. Cl.
*H01L 29/788* (2006.01)
*H01L 27/115* (2006.01)
*H01L 29/66* (2006.01)

(52) U.S. Cl.
CPC ......... *H01L 29/7881* (2013.01); *H01L 27/115* (2013.01); *H01L 27/11521* (2013.01); *H01L 29/66825* (2013.01)

(58) Field of Classification Search
USPC ....... 257/E29.17, 68–71, 296–309, 905–908, 257/E27.075, 225–234, 390, E27.076, 324, 257/410, 411; 438/257, 259, 275, 268, 267, 438/270, 276
See application file for complete search history.

(56) References Cited

U.S. PATENT DOCUMENTS

| | | | |
|---|---|---|---|
| 5,041,886 A * | 8/1991 | Lee | 257/320 |
| 5,315,142 A * | 5/1994 | Acovic et al. | 257/316 |
| 5,466,961 A * | 11/1995 | Kikuchi et al. | 257/379 |
| 5,467,305 A | 11/1995 | Bertin et al. | |
| 5,583,360 A * | 12/1996 | Roth et al. | 257/316 |
| 5,751,038 A | 5/1998 | Mukherjee | |
| 5,929,477 A * | 7/1999 | McAllister Burns et al. | 257/306 |
| 5,998,261 A | 12/1999 | Hofmann et al. | |
| 6,013,548 A * | 1/2000 | Burns et al. | 438/242 |
| 6,157,060 A | 12/2000 | Kerber | |
| 6,548,856 B1 * | 4/2003 | Lin et al. | 257/315 |
| 2004/0004863 A1 * | 1/2004 | Wang | 365/199 |
| 2007/0045709 A1 | 3/2007 | Yang | |
| 2007/0090453 A1 | 4/2007 | Lee et al. | |

FOREIGN PATENT DOCUMENTS

WO WO-02/45158 A2 6/2002

OTHER PUBLICATIONS

Jan. 15, 2014 Office Action for German Patent Application No. 102008021396.9.

* cited by examiner

*Primary Examiner* — David Vu
*Assistant Examiner* — Jonathan Han
(74) *Attorney, Agent, or Firm* — Schiff Hardin LLP

(57) ABSTRACT

A memory cell including a substrate with a protruding portion, the protruding portion having a side wall and a bottom, an upper doped region connected to a bit line, a lower region being closer to a bottom of the protruding portion than the upper region, a substrate contact, a control element configured to control a current flow between the lower region and the substrate contact, and a wordline portion, a first insulator near the wordline portion, a floating gate near the wordline portion, and a second insulator between the floating gate and the side wall of the protruding portion, wherein the wordline portion and the floating gate are arranged so that the channel is generate-able in the substrate near the side wall between the upper doped region and the lower region.

38 Claims, 14 Drawing Sheets

MEMORY CELL

BACKGROUND OF THE INVENTION

The present invention relates to a memory cell, a memory cell array and a method for producing the memory cell.

Electrical devices, for example, security controllers, micro controllers or chip cards, are implemented on a semiconductor device and comprise a storage element. Conventional storage elements e.g. are non-volatile mass storage elements like Flash elements. As semiconductor devices often comprise a huge number of storage elements or memory cells, the area of a memory cell needs to be reduced in order to enable an economic production of the semiconductor device by reducing the manufacturing costs due to the reduced chip area. Due to the fact that the NVM (NVM=Non Volatile Memory) is a significant compound of the chip card or the micro controller, the reduction of the area of the memory cell is of major importance for reducing the chip area of the semiconductor device. Because the number of memory cells on a semiconductor device also amounts to 36 k bytes, 260 k bytes or 1M bytes the memory of a semiconductor device is not only an item to be evaluated during the production definition of the semiconductor device, but also a major factor of the manufacturing costs of the semiconductor device. The required silicon area or chip area of the memory usually represents the lion's share of the total chip area of the semiconductor device.

Thus, a reduction or a decrease of the required area or chip area of the memory cell of the NVM affects the area of the chip by a multiple depending on the size of the memory, e.g. by a factor of 8000000 in the case of a memory with a size of 1M bytes. In case the NVM-related segment comprises 50% of the total chip area, a reduction of the area of the memory cell by 10% results in a reduction of the total chip area by 5%. This leads to a reduction of the manufacturing costs or the costs of production by 5%. Hence, a new concept for the structure of a memory cell is a key element for reducing the chip area and for decreasing the cost of manufacturing and thus creating an economically successful product.

A conventional memory cell comprises one or two transistors. Depending on the programming of a transistor, a threshold voltage is shifted upwards or downwards. Due to the value of the threshold voltage, a current through a cell comprising one or two transistors changes its value. The thus resulting difference in the current flow is detected by a sense amplifier and converted in a voltage, wherein this voltage has two logic values, 0 or 1. In a NOR-architecture of a memory array, each source region and each drain region needs to be contacted by a dedicated contact. These contacts require lavish silicon areas leading to an increase in the manufacturing costs. Therefore a modification of the structure of a memory cell can be a decisive step for reducing the required chip area.

BRIEF DESCRIPTION OF THE FIGURES

Embodiments of the present invention will be detailed subsequently referring to the appended drawings, in which:

FIG. 2b outlines a cross section view of the memory cell array depicted in FIG. 2a;

DESCRIPTION OF THE INVENTION

A memory cell comprises a substrate comprising a protruding portion, the protruding portion comprising a side wall, a bottom, an upper doped region connected to a bit line, a lower region being closer to a bottom of the protruding portion than the upper region, a substrate contact, a control element for controlling a current flow between the lower region of then protruding portion and the substrate contact, a wordline portion, a first insulator near the wordline, a floating gate near the wordline and a second insulator between the floating gate and the side wall of the protruding portion, wherein the wordline portion and the floating gate are arranged so that a channel is generate-able in the protruding portion near the sidewall of the protruding portion between the upper doped region of the protruding portion and the lower region of the protruding portion.

Apart from this, a method for manufacturing a memory cell comprises a treating of a surface of a substrate so that a protruding portion of a substrate is formed, a forming of an upper doped region in the protruding portion, wherein a lower region of the protruding portion is closer to a bottom of the protruding portion, a forming of a substrate contact and a control element for controlling a current flow between the lower region and the substrate contact, a producing of a wordline portion, a first insulator near the wordline, a floating gate near the wordline and a second insulator between the floating gate and the side wall of the protruding portion, so that the wordline portion and the floating gate are arranged so that a channel is generate-able in the protruding portion near the side wall of the protruding portion between the upper doped region of the protruding portion and the lower region of the protruding portion and a forming of a bit line connected to the upper doped region of the protruding portion.

Figure 1A:
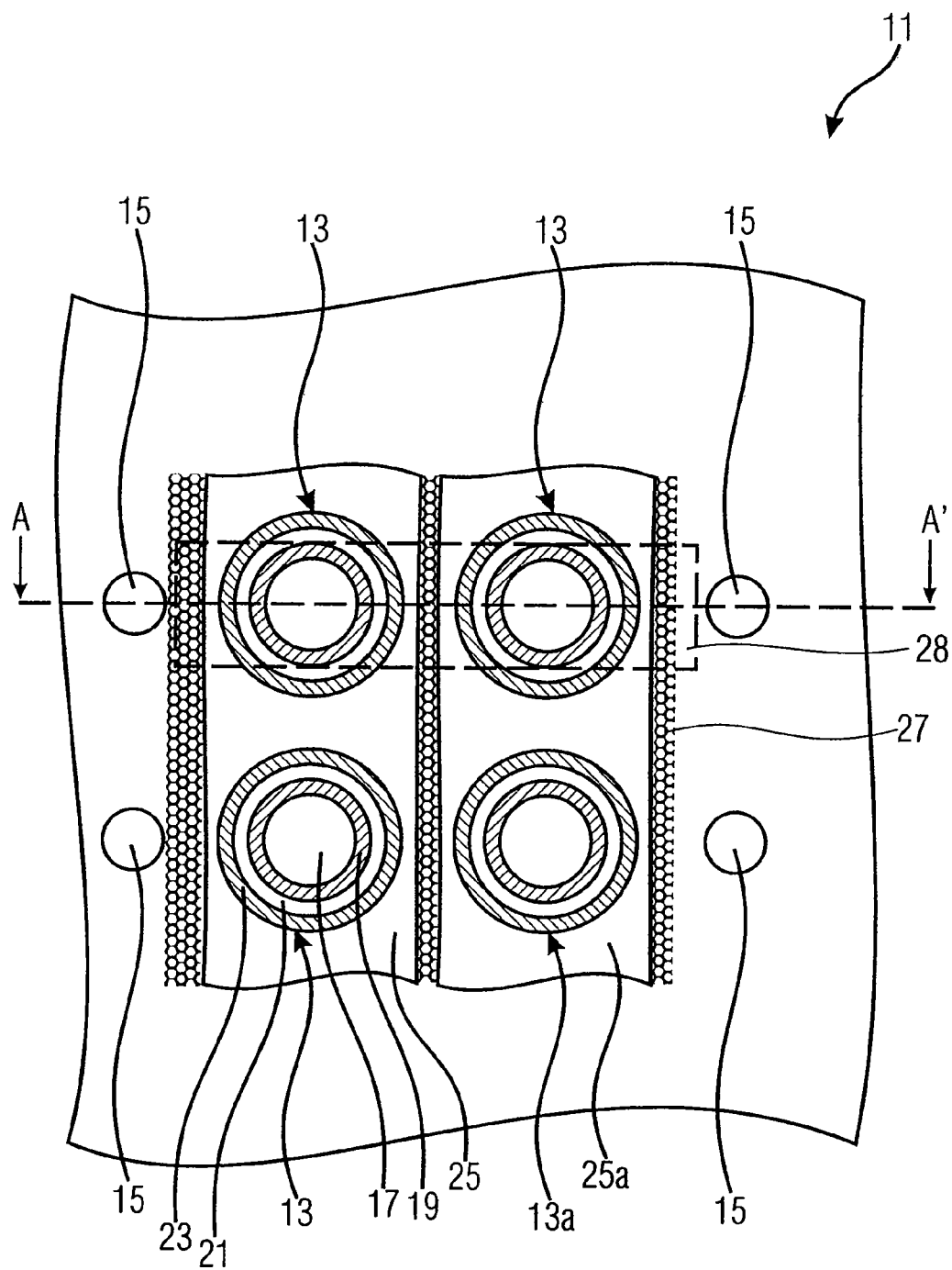
FIG. 1a shows a plan view of a memory cell array comprising a memory cell according to an embodiment of the present invention, wherein four memory cells are shown.

FIG. 1a shows a plan view of a memory cell array 11 comprising multiple memory cells according to an embodiment of the present invention, here four memory cells 13, and multiple substrate contacts 15, here four substrate contacts. The memory cell array depicted in FIG. 1a is only a part of a memory cell array implemented on a chip like a security controller or a micro controller.

The memory cell 13 comprises a protruding portion 17 and a first insulator 19, e.g. a tunnel oxide like a silicon dioxide ($SiO_2$). The first insulator 19 can be arranged such that it completely surrounds the protruding portion 17. The memory cell 13 further comprises a floating gate 21 or a floating gate region, which can be arranged such that the floating gate 21 completely surrounds the first insulator 19. The floating gate 21 comprises a conductive material for example a continuous portion of a conductive material or can comprise a continuous portion of an insulating material having islands or regions of a conductive material, like for example a polysilicon, wherein these islands are separated from each other by the insulating material. Hereby the islands of the conductive material can serve as charge traps. The insulating material can have a nitride or a silicon nitride. The first insulator 19 is positioned between the protruding portion 17 and the floating gate 21.

The floating gate 21 is located between the first insulator 19 and a second insulator 23, wherein the second insulator 23 can be arranged such that it completely surrounds the floating gate 21. The second insulator or the second insulator region 23 is located between the floating gate 21 and a wordline portion 25. The wordline portion 25 can be arranged such that it completely surrounds the second insulator 23. The wordline portion 25 is positioned between an insulating region 27 and the second insulator 23. The wordline portion 25 can completely surround the second insulator 23 in the memory cell 13 according to the present invention. The insulating region 27 is positioned between the wordline portion 25 and a further wordline portion 25a of an adjacent memory cell 13a. In the memory cell 13, 13a according to the present invention the protruding portion 17, the first insulator 19, the floating gate 21, the second insulator 23 or the wordline portion 25 can be ring-shaped or square shaped and all the elements can be concentrically positioned against each other.

A bit line 28 indicated here by a broken line extends over the memory cell 13, the adjacent memory cell 13a and further memory cells of the memory cell array 11 shown in FIG. 1a.

Figure 1B:
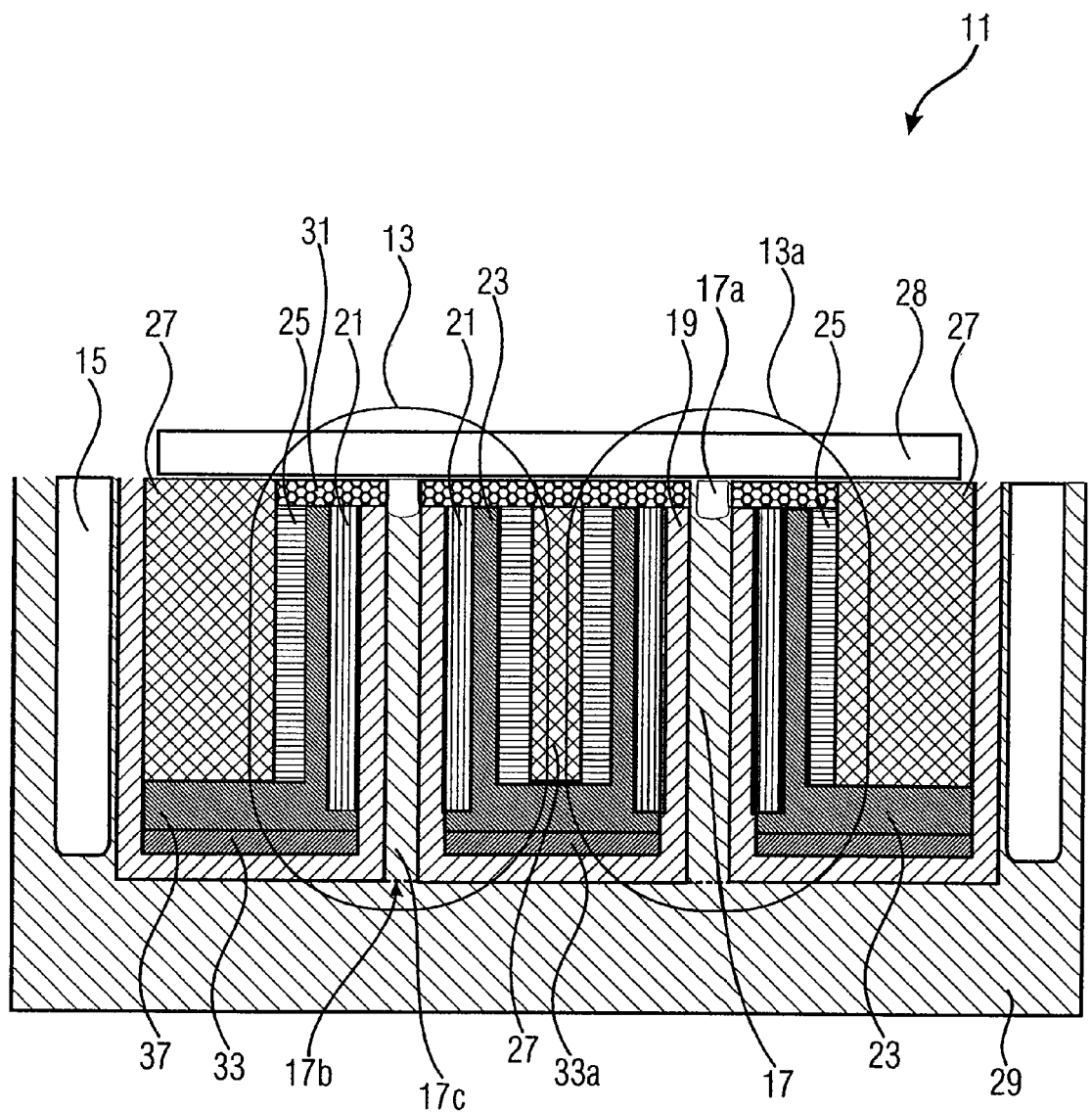
FIG. 1b is a cross section view of the memory cell array depicted in FIG. 1a in a direction AA'.

In FIG. 1b a cross-sectional view of the memory cell array 11 is outlined in a sectional view AA'. A substrate 29 can be seen in which the memory cell array 11 is implemented. The substrate 29 comprises the protruding portions 17, wherein the protruding portions 17 can be made of the same material as the substrate 29. An upper region 17a of the protruding portion 17 can have a higher doping concentration than the substrate 29 and, hence, have a higher conductivity than the substrate 29. The upper region 17a of the protruding portion 17 contacts the bit line 28. The protruding portion has a bottom 17b from which the protruding portion protrudes from a lower substrate plane. The lower region 17c of the protruding portion 17 is located between the bottom 17b and the upper region 17a.

An insulating layer 31 is arranged between the bit line 28 on the one hand and the first insulator 19, the floating gate 21, the second insulator 23, the wordline portion 25 or the insulating region 27 on the other hand. As shown in FIG. 1b, the insulating layer 31 can be positioned so that it covers the first insulator 19, the floating gate 21, the second insulator 23, the wordline portion 25 or the insulating region 27. Apart from this the insulating layer 31 can be positioned such that it is flush with a top surface of the upper region 17a in the protruding portion 17. The thus implemented insulating layer 31 can be formed in a cavity in the structure below the bit line 28. The insulating layer 31 can for example have a nitride. The protruding portion 17, the first insulator 19, the floating gate 21, the second insulator 23, the wordline portion 25 and the insulating region 27 can extend from a surface of the insulating layer 31 facing the substrate 29 into the substrate 29. The layers can be arranged such, as shown in FIG. 1b, that they extend in a direction vertically to a surface of the chip in which the memory cell array 11 is implemented. The first insulator 19 can border on the side wall of the protruding portion 17 and extend in a direction vertically to the chip surface to the bottom of the protruding portion 17, wherein the bottom of the protruding portion 17 is arranged on an end of the protruding portion 17 facing away from the end of the protruding portion 17 on which the upper region 17a borders.

A control element 33 is formed on a region of the first insulator 19, so that the region of the continuous first insulator 19 is arranged between the control element 33 and the substrate 29. Hence, the control element 33 is separated from the substrate 29 by the continuous insulator 19. As shown in FIG. 1b, the region of the first insulator 19 arranged between the protruding portion 17 and the floating gate 21 and the region of the first insulator 19 arranged between the control elements 33, 33a and the substrate 29 can be implemented in a continuous layer. The continuous layer or the first insulator 19 can have a silicon oxide.

A further insulating portion 37 is arranged between the wordline portion 25 and the control element 33. Thus, the control element 33 is separated from the wordline portion 25. As shown in FIG. 1b, the further insulating portion 37 and the second insulator 23 can be implemented in a continuous layer of an insulating material, e.g. a silicon nitride or an ONO-material (ONO=oxide-nitride-oxide). The insulating region 27 is arranged between the wordline portion 25 and the wordline portion 25a of the adjacent memory cell 13a, so that the wordline portion 25 is separated from the wordline portion 25a of the adjacent memory cell 13a. The substrate contacts 15 are produced on the substrate 29 and can extend in a direction vertically to a surface of the chip area. The memory cell array 11 can be arranged such that the memory cell 13 or the adjacent memory cell 13a is arranged between the substrate contacts 15.

Depending on a potential of the control element 33, which can be made of a conductive material, like for example a metal or a polysilicon, a conductive channel between the substrate contact 15 and a lower region of the protruding portion 17 can be generated, so that charge carriers can flow from the substrate contact 15 to the protruding portion 17, or vice-versa. The potential of the control element 33 can be adjusted by a voltage between the substrate 29 and the control element 33. The control element 33 and a control element 33a of the adjacent memory cell 13a can be electrically connected such that when a proper voltage is applied between the control elements 33, 33a and the substrate 29, a conductive channel between the lower regions of the multiple protruding portions 17 and the substrate contact 15 is generated. At the same time the control elements 33, 33a of a column of the memory cells 13, 13a can all be electrically connected together, so that a conductive channel can be generated between the lower regions of all the memory cells 13, 13a of one column and the substrate contacts 15 in parallel or at the same time when applying a proper voltage between the control elements 33, 33a on the one hand and the substrate 29 on the other hand. In addition to this all the control elements 33, 33a of a row, a column, a bank or the complete memory cell array 11 can be implemented in a continuous layer extending across the related memory cells 13, 13a, wherein the protruding portions 17 can pierce or extend across the continuous layer. The thus implemented continuous layer can e.g. serve as a large gate electrode of a such implemented transistor controlling a current flow between the protruding portions 17 of all the memory cells 13, 13a and the substrate contacts 15. The such implemented transistor comprises a large continuous gate electrode only interrupted or perforated by the recesses in the continuous layer formed by the protruding portions 17.

A concentration of charge carriers in the protruding portion 17 in a domain between the lower region 17c and the upper region 17a can be adjusted by a concentration of charge carriers on the floating gate 21 or by a potential applied to the wordline portion 25. Hence, the conductivity of the domain between the upper region 17a and the lower region 17c of the protruding portion 17 can be controlled by a potential of the wordline portion 25 serving as a control gate or by the charge concentration on the floating gate 21.

Therefore, in a memory cell according to the present invention, the set-up and the structure of the memory cell can be selected such that the concentration of electrons on a floating gate and the potential of the wordline can be adjusted in order to influence the concentration of holes in the protruding portion 17. As the concentration of holes in the protruding portion 17 can be controlled by the concentration of charge carriers on the floating gate 21 and the potential of the wordline portion 25, both values can be adjusted in a way that the concentration of charge carriers or holes in the protruding portion 17 exceeds a dedicated threshold. A sense amplifier connected in series to the bit line 28 can detect this effect that the concentration of charge carriers in the protruding portion 17 exceeds this threshold and detect this state as a logical value 0 or 1.

As the concentration of charge carriers in the protruding portion 17 depends on the potential of the wordline portion, one of the memory cells 13, 13a can be selected by adjusting the potential of the respective wordline portion 25, 25a, while the potentials of the other wordline portions 25, 25a allocated to the same bit line 28 remain at a different level of the potential. Therefore, depending on the concentration of the charge carriers on the floating gate 21 of the selected memory cell 13, 13a, the content of the memory cell is read and identified as a logical 0 or a logical 1.

When programming the memory cells 13, 13a, the potential of the control element 33 or the control elements 33, 33a is adjusted such that the substrate contact 25 is insulated from the lower region of the protruding portion 17, so that no conductive channel is generated between the lower region of the protruding portion 17 and the substrate contact 25. The voltage between the bit line 28 and the wordline portion 25, 25a can be adjusted so that the electrons can tunnel across the first insulator 19 and accumulate on the floating gate 21. Hence, the content of the memory cell 13, 13a can be established by the voltage between the wordline portion 25, 25a and the bit line 28 when programming the memory cell 13, 13a. So the fact whether the memory cell 13, 13a stores a logical value of 0 or a logical value of 1 after programming is defined by the voltage between the wordline portion 25, 25a and the bitline 28.

The domain between the upper region 17a of the protruding portion 17 and the lower region of the protruding portion 17 serves as an active area of a transistor of which the conductivity is controlled by the concentration of charge carriers on the floating gate 21 and the potential of the wordline portion 25. The domain between the substrate contact 15 and the lower region of the protruding portion 17 serves as an active area of a selection transistor of which the conductivity is adjusted by the potential of the control element 33.

In other words, the memory cell array 11 comprises the memory cells 13, 13a, here the Flash cells being positioned vertically to a surface of the chip. Each Flash cell can be formed of two in series connected vertically positioned transistors. Hence, a reduction of the chip area can be achieved compared to a Flash cell having a laterally positioned transistor. The upper transistor which comprises the upper region 17a, a domain of the protruding portion 17 between the lower region 17c and the upper region 17a, the floating gate 21 and the wordline portion 15 serves as the actual memory cell, wherein a drain region of the transistor is connected to the bit line 28. The domain in the substrate 29 between the substrate contact 25 and the active area of the actual memory cell transistor serves as the active area of a selection transistor of which the conductivity is controlled by a potential applied to the control element 33. Hence, a positive charge carrier can move from the bit line 28 to the substrate 29 when both transistors, the memory cell transistor and the selection transistor are activated. As already mentioned above, the memory cell transistor is activated when the concentration of charge carriers on the floating gate 21 and the potential applied to the wordline portion 25, 25a exceed a dedicated threshold.

The source-contact of the selection transistor can be implemented by producing an increased p-doping concentration in a domain of the substrate bordering the substrate contact. The gates of all the selection transistors or the lower transistors can be connected in parallel, such that a voltage applied to a gate or a gate conductor can activate all selection transistors of all the memory cells allocated to one bit line.

In a further memory cell array comprising a plurality of memory cells according to an embodiment of the present invention, the control elements or gates of the selection transistors can be connected in parallel, such that a sector, a bank or a complete array can be selected at the same time or in parallel. Depending on the activation of a wordline or the wordline portion, a dedicated memory cell of the sector, bank or array can be read via the bit line 28.

As already explained above, when programming the cell, the selection transistors are blocked and the lower regions of the protruding portions 17 are insulated from the substrate contacts 15. During programming the potential of the bit line 28 or the value of the voltage between the substrate 29 and the bit line 28 define the voltage between the floating gate 21 and the protruding portion 17 and, therefore, the content of the memory cell 13. When the voltage between the floating gate 21 and the protruding portion 17 exceeds a dedicated value, the electrons can tunnel through the first insulator 19 or the tunnel oxide.

In order to make the electrons tunnel through the first insulator 19, a positive voltage is applied between the wordline portion 25 and the bit line 28, wherein the wordline portion 25 has a positive potential in relation to the bit line 28. Hence, when programming the Flash cell, the voltage between the wordline portion 25 and the bit line 28 either exceeds a dedicated value and makes the electrons tunnel through the first insulator 19 or does not exceed a dedicated value, so that the electrons do not tunnel through the first insulator 19. When programming the memory cell 13, the memory cell 13 is in a conductive state, so that a conductive channel is generated between the upper region 17a and the lower region of the protruding portion 17.

In contrast to programming the memory cell 13 by applying a positive voltage or a positive potential to the wordline portion 25 or the control gate, the memory cell 13 can be erased by applying a negative voltage or a negative potential to the wordline portion 25 or the control gate of the memory cell transistor and make the electrons move from the floating gate or the second insulator 23 to the protruding portion 17. Hence, when erasing the memory cell 13, the electrons tunnel through the first insulator 19 in a direction opposite to the direction when programming the memory cell 13. During an operation mode, a potential applied to the bit line or a voltage applied between the substrate 29 and the bit line 28 lower than the programming voltage can prohibit the electrons from tunneling through the first insulator 19 due to the Fouler-Nordheim effect and, thus prevent a programming of the memory cell 13. In this case the applied voltage can be slightly lower than the programming voltage, so that the voltage is e.g. in a range between 0.5 Volt and 1.5 Volt below the programming voltage. A prerequisite for the stable voltage on the first insulator 19 or the tunnel oxide is that the selection-transistor close to the bottom of the protruding portion or close to the lower region 17c of the protruding portion 17 is not blocked or not switched off.

As the structure of the memory cell 13 consists of the memory transistor comprising the depleted body or the protruding portion 17 and the selection transistor wherein a current flows through the memory transistor in the vertical direction in an on-state of this transistor and the current flows through the selection transistor in the vertical or the lateral direction (potentially a U-curve current flow) the required chip area can be reduced in comparison to conventional memory cells. The selection transistor can comprise a plurality of the control elements 33, 33a spread over several memory cells 13, 13a, wherein all the selection transistors are switched on during a read mode at the same time. Because the active area of the transistors of the memory cell can extend in a vertical direction perpendicular to a surface of the chip and the active area of the selection transistor can at least partially extend in a vertical direction, a memory cell according to an embodiment of the present invention can have a smaller chip area compared to conventional memory cells.

As the floating gate of the memory cell 13, 13a according to an embodiment of the present invention can extend in a direction vertical to the surface of the chip, a multi-level-cell with a storage capacity of more than one bit, or even more than two bits, can be implemented in a similar way and the efficiency of the memory cells according to the present invention can be high in relation to a conventional memory cell. Due to the fact that the number of bits stored in a memory cell can be increased the chip area required for a memory device with a dedicated storage capacitance can be reduced, and, hence, the manufacturing costs for a chip comprising such a storage can be decreased. As the memory cell 13 according to the present invention can be implemented in the substrate 29 such that the memory cell 13 has a vertical extension that is more than three times higher than a lateral extension in the direction parallel to the surface of the chip, the lateral extension of the memory cell 13 can be reduced, while the storage capacitance of the memory cell or the amount of the charge carriers which can be stored on the floating gate can be kept at a high level. Therefore, the storage capacitance of the memory cell 13, 13a can be kept at a constant level, while shrinking the electrical circuit implemented in the chip.

Apart from that the electrical coupling or the stress of the adjacent memory cells 13, 13a is reduced, as each of the memory cells 13, 13a comprises its own wordline portion 25, 25a. Thus, any disturbing effects on the adjacent memory cell 13a when programming or erasing the memory cell 13 according to the present invention are reduced in the memory cell array 11 in comparison to a conventional memory cell array. Due to the structure of the memory cell 13 according to the present invention, the programming or erasing of the content of the memory cell can be performed in a very efficient way, as the field lines of the electrical field converge in the channel of the cell transistor or the protruding portion 17 and, hence, the tunneling effect is intensified.

As each of the memory cells 13 in the memory cell array 11 can be contacted via the bit line 28, while the floating gate 21 and the wordline portion 25 are insulated from the bit line 28 by the insulating layer 31, an electrical connection to the memory cell 13 according to the present invention can be produced or processed in a simple way, thus, further reducing the manufacturing costs of a chip comprising the memory cell 13.

Figure 2A:
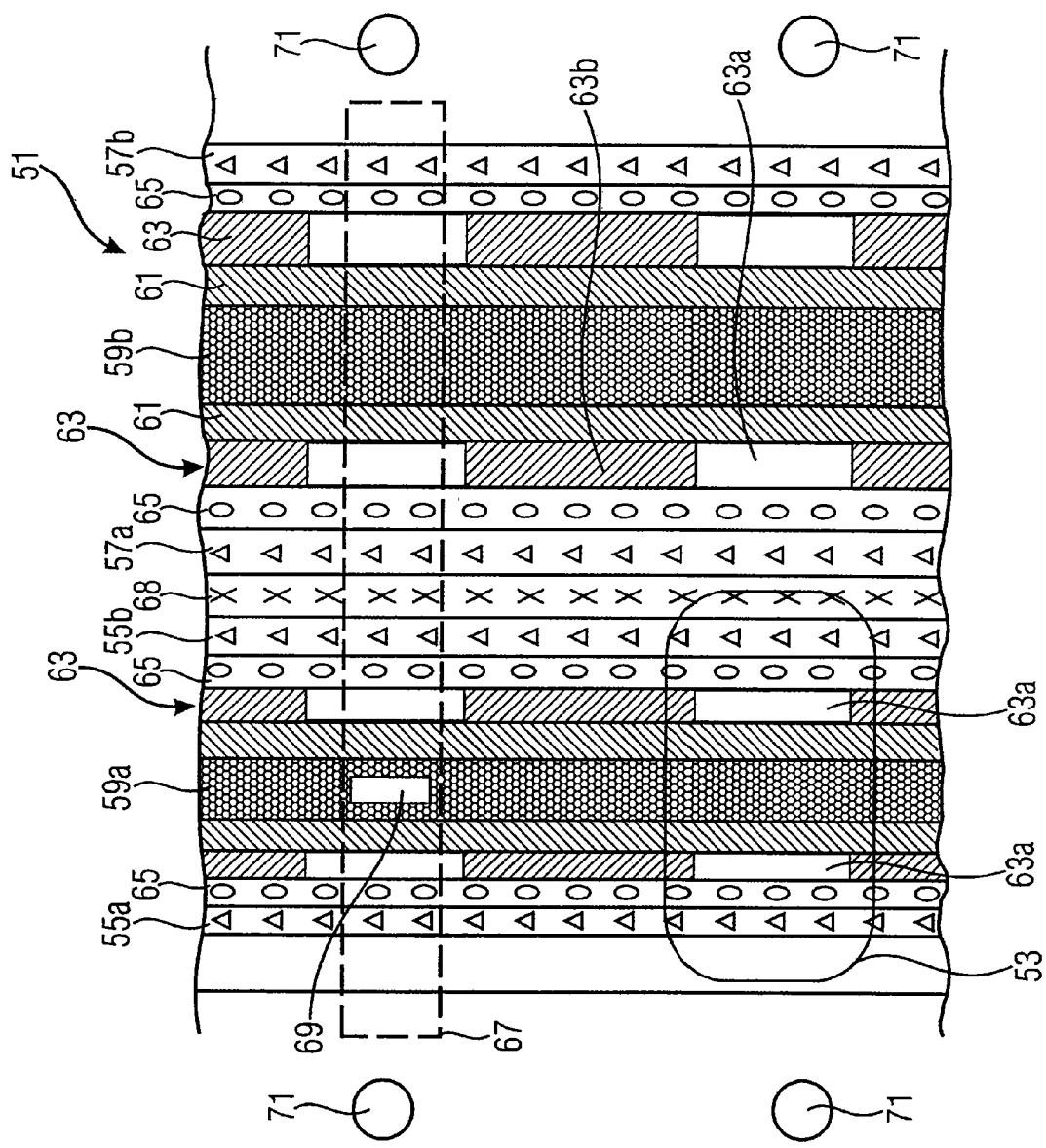
FIG. 2a shows a memory cell array comprising several memory cells according to an embodiment of the present invention.

A further memory cell array 51 according to the present invention is presented in FIG. 2a, the memory cell array 51 comprising a memory cell 53 according to the present invention. The memory cell array 51 comprises a first wordline strip 55a and a second wordline strip 55b, wherein the first wordline strip 55a and the second wordline strip 55b are allocated to the same row of the memory cells 53. The memory cell array 51 further comprises a first wordline strip 57a of a further row of the memory cells 53 and a second wordline strip 57b of a further row of the memory cells 53. FIG. 2a only presents a part of the memory cell array 51, wherein a plurality of further rows can be arranged in the memory cell array 51. A protruding strip 59a and a protruding strip 59b allocated to the further row both protrude from a substrate and can have the same material as the substrate. The protruding strip 59a is arranged between the first wordline strip 55a and the second wordline strip 55b, while the protruding strip 59b of the further row is arranged between the first wordline strip 57a of the further row and the second wordline strip 57b of the further row.

A first insulator strip 61 is arranged on both sides of the protruding strips 59a, 59b between floating gate strips 63 and the protruding strips 59a, 59b. The floating gate strip 63 comprises floating gate regions 63a and insulating segments 63b. The insulating segments 63b are arranged between the floating gate region 63a of the memory cells 53 of a first column and a floating gate region of a second column of the memory cells 53. Second insulator strips 65 are arranged between the floating gate strips 63 and the wordline strips 55a, 55b, 57a, 57b.

A bit line 67 of which a part is shown in FIG. 2a extends over the memory cells 53 of the column. Each memory cell 53 is electrically connected to the bit line 67 via an upper doped region 69 in the protruding strips 59. Hence, the memory cells 53 of a column are connected to each other by the bit line 67. The wordline strips 55a, 55b, 57a, 57b are insulated from the bit line 67 by an insulating layer not shown in FIG. 2a. As can be seen from FIG. 2a, a group of memory cells 53 is located between two substrate contacts 71. A cell insulator strip 68 is arranged between the wordline strips 55b, 57a, wherein the cell insulator strip 68 separates the memory cells 53 of the two adjacent rows.

Figure 2B:
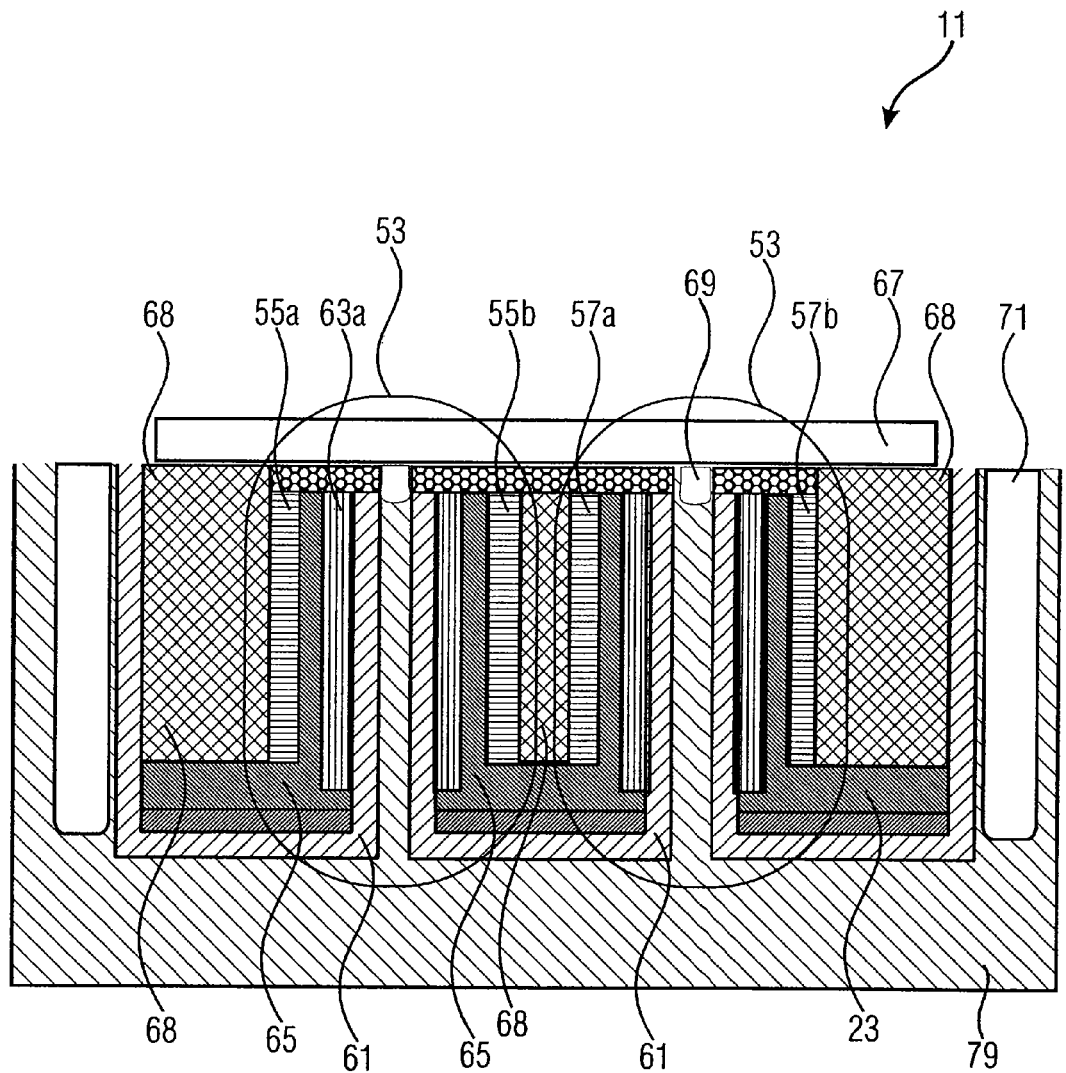

FIG. 2b depicts a cross-section view of the structure of the memory cell array 51. In addition to the elements already explained in the description of FIG. 2a, it can be seen in FIG. 2b that between the protruding strips 59a, 59b, a region of the first insulator strip 61 and an upper insulating layer 75 are arranged. The upper insulating layer 75 can also be strip-shaped and essentially be positioned parallel to the wordline strips 55b, 57a. A control electrode 77 is arranged between the region of the first insulator strip 61 and the upper insulating layer 75. The control electrode 77 can also be strip-shaped and be essentially positioned parallel to the wordline strips 55b, 57a. The region of the first insulator strip 61 is arranged between the control electrode 77 and a substrate 79. The control electrode 77 can be made of a conductive material as, for example, a metal or a polysilicon.

The upper insulating layer 75 is arranged between the wordline strips 55b, 57a on the one hand and the control electrode 77.

The memory cell 53 according to the present invention is formed in each domain of the protruding strips 59a, 59b between two facing floating gate regions 63a, wherein each of the both floating gate regions 63a can border on the first insulator strips 61 positioned between the both floating gate portions 63a of the memory cell 53.

The functionality of the memory cell 53 can be deviated from the description of the functionality of the memory cells 13 in the memory cell array 11, as outlined in FIGS. 1a-b. The concentration of the charge carriers in the domain of the protruding strip 59a, 59b allocated to the memory cells 53 depends on a potential applied to the wordline strips 55a, 55b, 57a, 57b respectively allocated to the memory cells 53 and the concentration of charge carriers in the floating gate regions 63a allocated to the memory cell 53. Apart from this, a conduction channel between the substrate contact 71 and a lower region of the respective domain of the protruding strip 59 can be generated by a respective potential applied to the control electrode 77. Hence, like the memory cell 13 in the memory cell array 11 explained above, the memory cell 53 also has a two transistor structure, wherein a region of the substrate 79 close to the control electrode 77 forms an active area of a selection transistor and the domain in the protruding strip 59 forms the active area of a memory transistor. The control electrodes 77 of the memory cell array 51 can be connected in parallel, so that all the selection transistors of the memory cell array 51 can be switched on or off at the same time.

Due to the symmetrical structure of the memory cell 53 comprising both floating gate portions 63 on opposite sides of the domain of the protruding strip 59, a high concentration of field lines generated by both floating gate portions 63a can be achieved.

Figure 3:
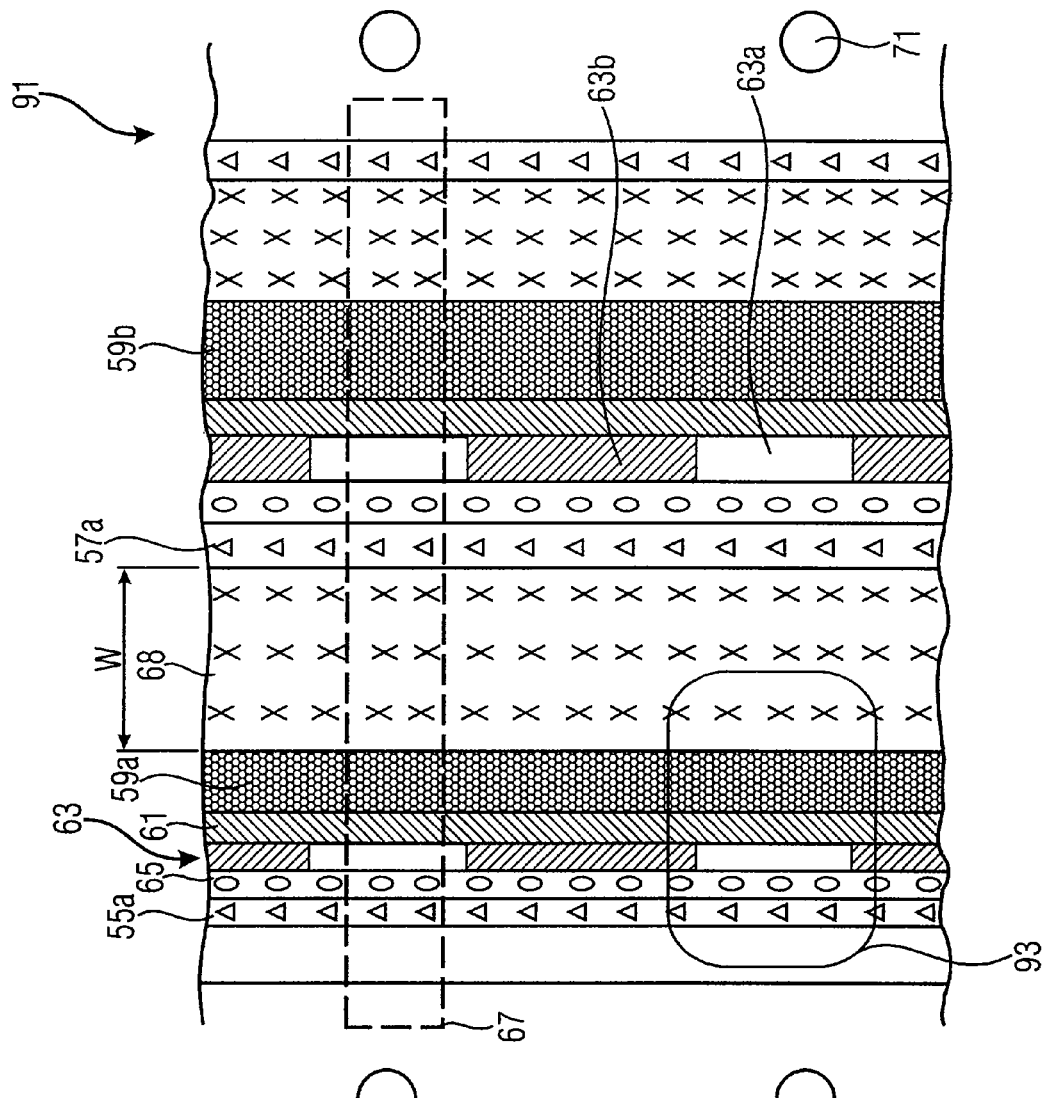
FIG. 3 shows a plan view of a memory cell array comprising several memory cells according to an embodiment of the present invention.

A further structure of a memory cell array 91 comprising a memory cell 93 according to a further embodiment of the present invention is presented in FIG. 3. In the following, elements having the same functionality as the elements in the memory cell array 51 are denoted with the same reference numerals. Apart from this, the following description of the structure and the functionality of the memory cell array 91 and the memory cells 93 is limited to the differences in the structure and the functionality to the memory cell array 51.

In contrast to the memory cell array 51, each of the memory cells 93 only comprises one floating gate portion 63a, because one of the first insulator strips 61, the floating gate strip 63 and the second insulator strip 65 related to each protruding strip 59a, 59b is left out, so that the structure as shown in FIG. 3 is produced. In order to shield the domain of the protruding strips 59a, 59b allocated to the memory cells 93 against the disturbing effects of the wordline strip 57a of the adjacent memory cell 53, the cell insulator strip 68 in the memory cell array 91 can have a higher width w than the cell insulator strip 68 in the memory cell array 51.

Figure 4:
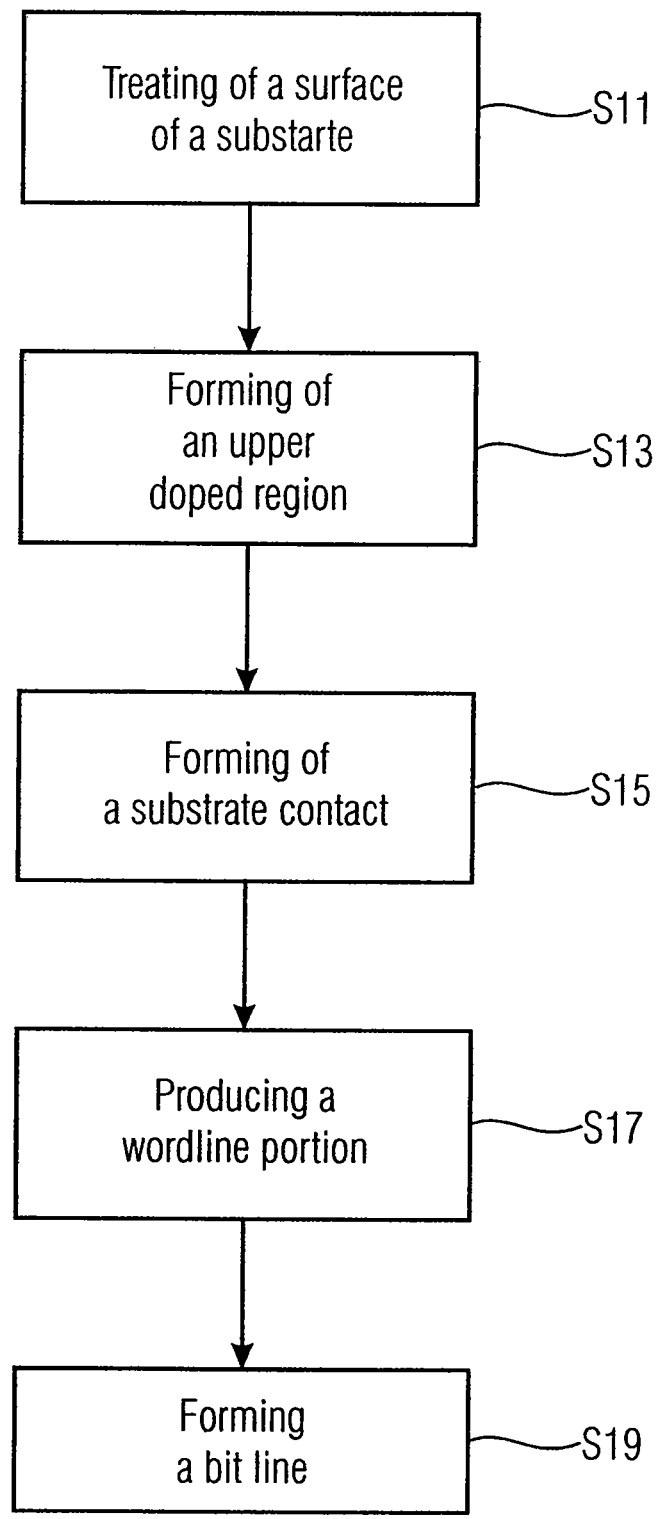
FIG. 4 shows a method for producing a memory cell according to an embodiment of the present invention in a memory cell array.

The memory cell arrays 11, 51, 91 outlined above can be produced by a method of producing shown in FIG. 4. In a step S11, a surface of a substrate is treated, so that a protruding portion of the substrate is formed. The protruding portions of the substrate can be produced by removing the substrate material surrounding the protruding portion, so that a needle-shaped part of the substrate protrudes from the remaining substrate material. In a following step S13, an upper doped region is produced or formed in the protruding portion of the substrate, wherein the upper doped region is positioned at an end of the protruding portion facing away from an end at the bottom of the protruding portion at which the lower region is positioned.

In a following step S15, a substrate contact is produced or formed and a control element is produced or formed, wherein the control element serves for controlling a current flow between the lower region and the substrate contact when operating the memory cell to be produced by the method for producing according to the present invention. After this, a wordline portion, the first insulator near the wordline portion, a floating gate near the wordline portion and a second insulator positioned between the floating gate and a side wall of the protruding portion are produced in a step S17, so that the wordline portion and the floating gate are arranged such that a channel is generate-able in the protruding portion of the substrate near the side wall between the upper doped region and the lower region. In a step S19, a bit line is then formed, which is connected to the upper doped region of the memory cell. The bit line serves to contact the memory cell, as already explained above.

In addition to the steps mentioned above, an insulating portion can be produced covering the wordline portion or the floating gate in order to insulate the bit line from the wordline portion or the floating gate.

Figure 5A:
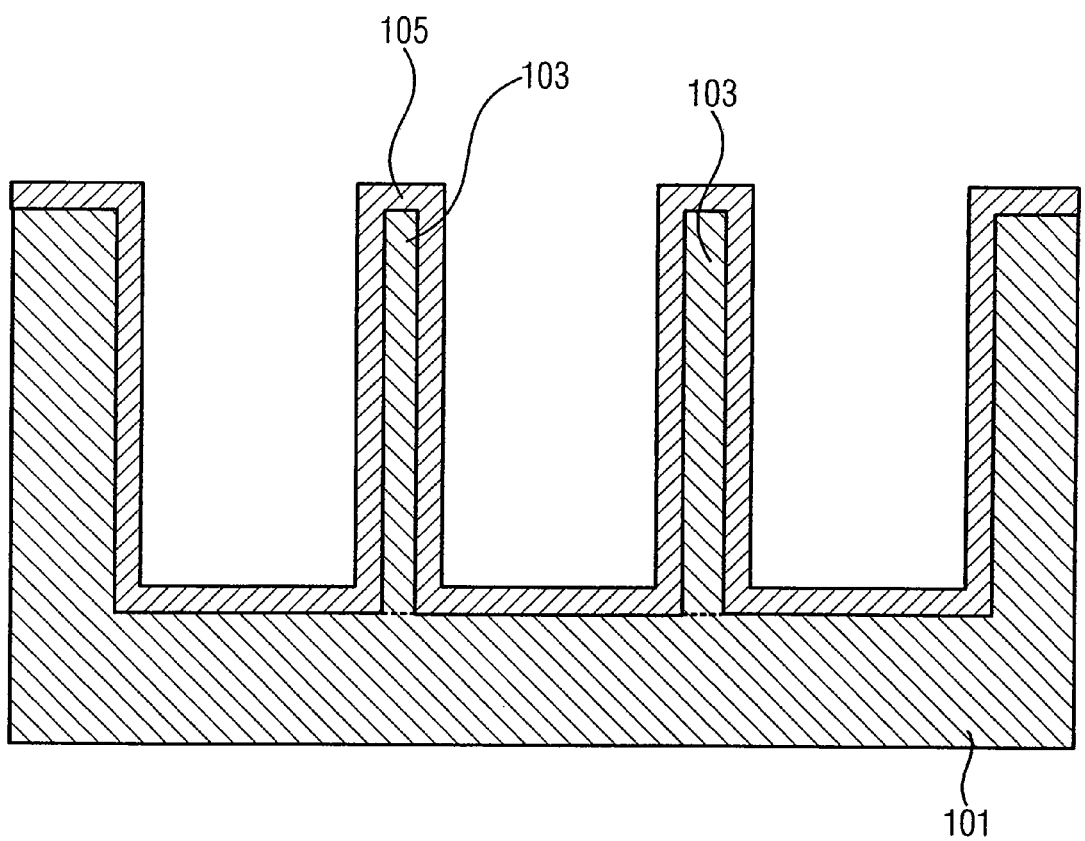
FIGS. 5a-h are schematic views of the memory cell array outlined in FIG. 1b during production by means of a production method according to an embodiment of the present invention.

In the following, a further method for producing the memory cell arrays 11, 51, 91 is depicted in the schematic views of FIGS. 5a-h. First, a substrate 101 is treated at its surface in order to produce a protruding portion 103 or a plurality of protruding portions 103. For example, the surface can be treated by a so called STI-process (STI=Shallow Trench Insulation), wherein a selective etching can be performed in a photolithographic structuring method. As a depth of the memory cell to be produced is in a range of 1 µm a modified STI process is applied leading to a higher processing depth. After this, a first insulation layer 105 is deposited on the substrate 101 wherein the insulation layer 105 covers the surface of the substrate 101 including the sidewall and the surface of the protruding portion 103. The insulation layer 105 can for example comprise an oxide material, like a silicon oxide. Thus, an assembly as shown in FIG. 5a is produced.

Consecutively a layer 107 of a conductive material is so deposited on the first insulation layer 105, that the layer 107 does not cover the sidewall of the protruding portion 103. The deposition of the layer 107 of the conductive material serves to produce the gate of the selection transistor or bottom transistor in the memory cells 13, 53, 93 according to the present invention.

Figure 5B:
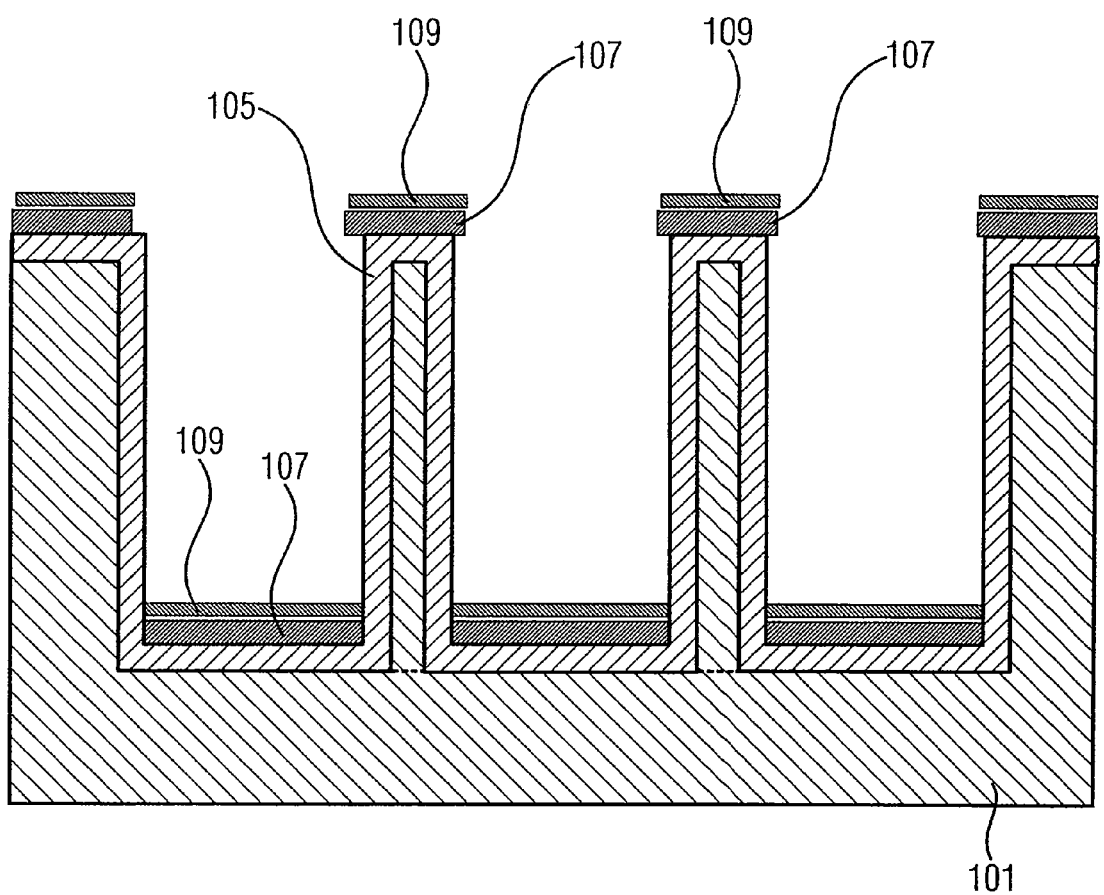

After this, a second insulation layer 109 which, for example, can comprise a nitride, like a silicon nitride, is deposited on a surface of the layer 107 facing away from the substrate 101. The second insulation layer 109 can be deposited such that it does not cover the side wall of the protruding portion 103. The second insulation layer 109 serves to separate the gate of the bottom transistor implemented in the layer 107 from a floating gate to be produced in a later step of the method of producing according to the present invention. Hence, an assembly as shown in FIG. 5b is produced.

Figure 5C:
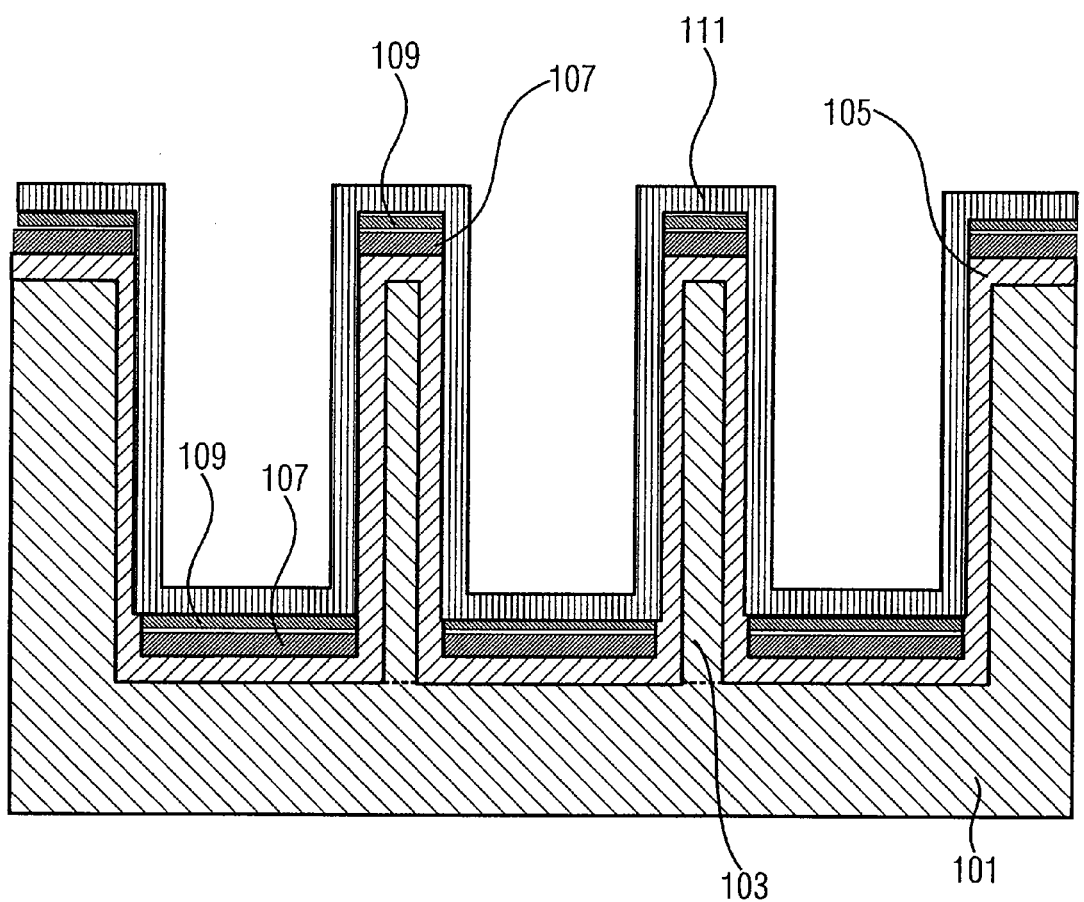

A second layer 111 of a conductive material is then formed on the first insulation layer 105 on the sidewalls of the protruding portion 103 and on a surface of the second insulation layer 109. The second layer 111 of the conductive material is deposited on a surface of the layer 107 facing away from the protruding portion 103 and on a surface of the second insulation layer 109 facing away from the substrate 101. The second layer 111 can be deposited such that a continuous layer extending over a portion of the first insulation layer 105 and the second insulation layer 109 is formed. The conductive material of the layer 111 can for example comprise a polysilicon. Thus an assembly as shown in FIG. 5c is produced.

Figure 5D:
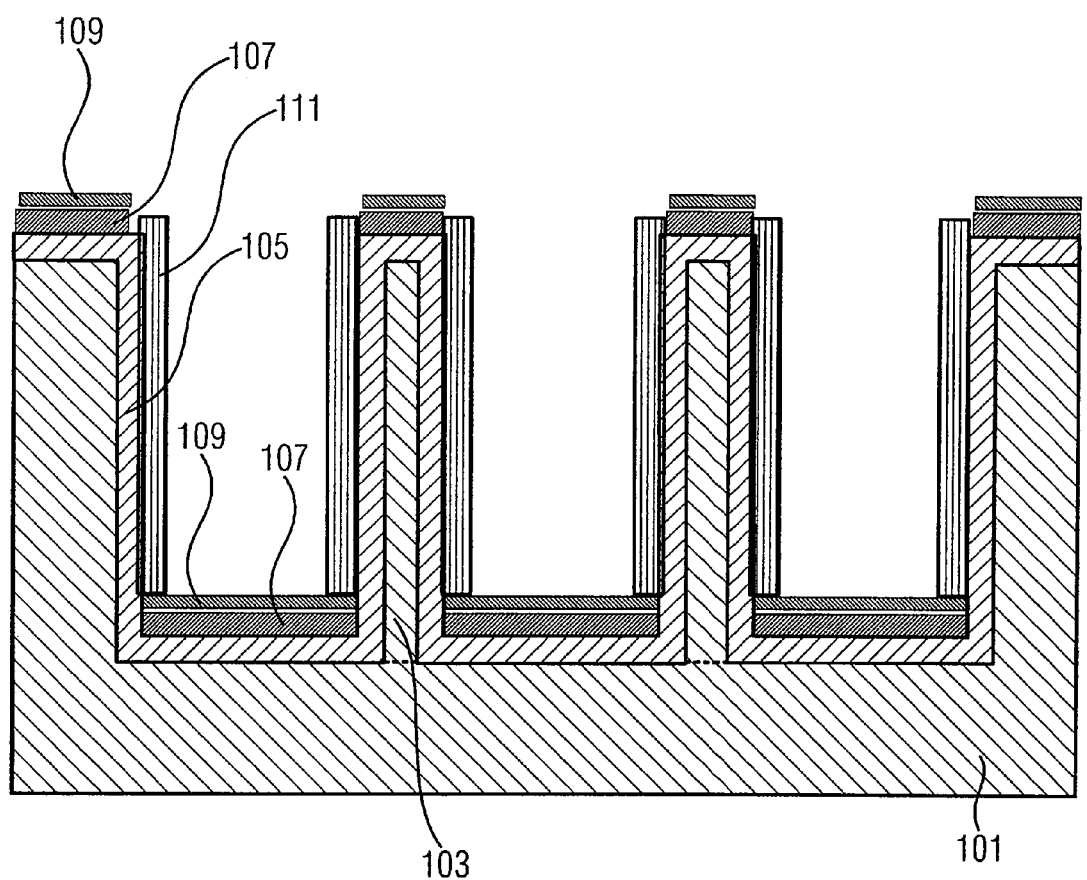

Then a portion or multiple portions of the second layer 111 of the conductive material are removed in order to produce an assembly as shown in FIG. 5d. The selective removal of the second layer 111 of the conductive material can e.g. be performed by an anisotropic poly recess etch process when the conductive material comprises a polysilicon. The thus remaining portions of the second layer 111 of the conductive material serve as a floating gate or floating gate portions in the memory cells 13, 53, 93.

Figure 5E:
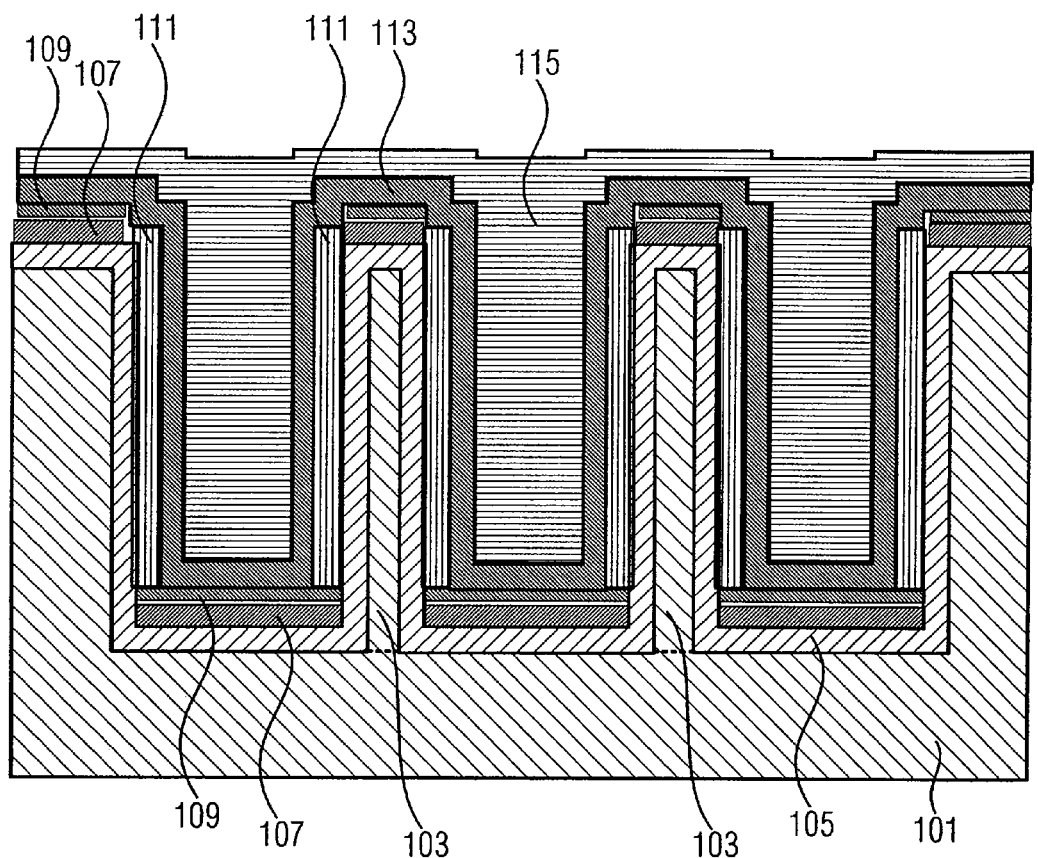

A third insulating layer 113 is then deposited on the assembly shown in FIG. 5d, so that it covers the surface of the second insulation layer 109 facing away from the substrate 101 and a surface of the second layer 111 facing away from the protruding portion 103. The third insulating layer 113 can for example comprise an ONO material. A third layer 115 of a conductive material is then deposited on the third insulating layer 113, wherein the third layer 115 of the conductive material can comprise a metal material or a polysilicon material. Hence, an assembly as shown in FIG. 5e is produced.

Figure 5F:
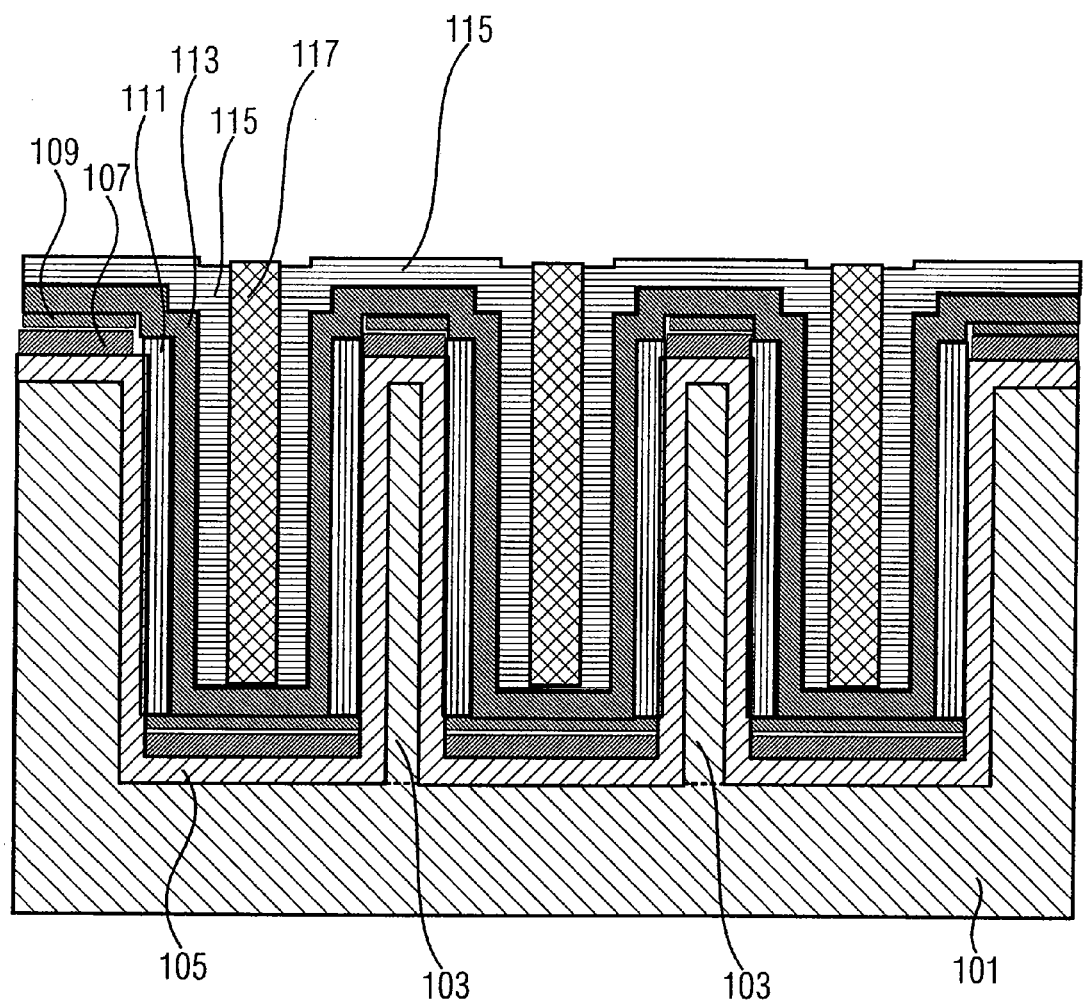

After this, a surface of the third layer 115 of the conductive material is structured, for example, by means of a photolithographic process and a consecutive selective etching process such that a recess is formed in the third layer 115 of the conductive material. The thus formed recess is then filled with an insulating material such that a portion 117 is produced. A so produced structure is shown in FIG. 5f. A surface of the structure shown in FIG. 5f is then so planarized, that portions of the layers 105, 107, 109, 113, 115, 117 are removed and the protruding portions 103 are unsealed. The process of planarizing the surface of the assembly can be performed by etching or chemical mechanical polishing, for example.

Figure 5G:
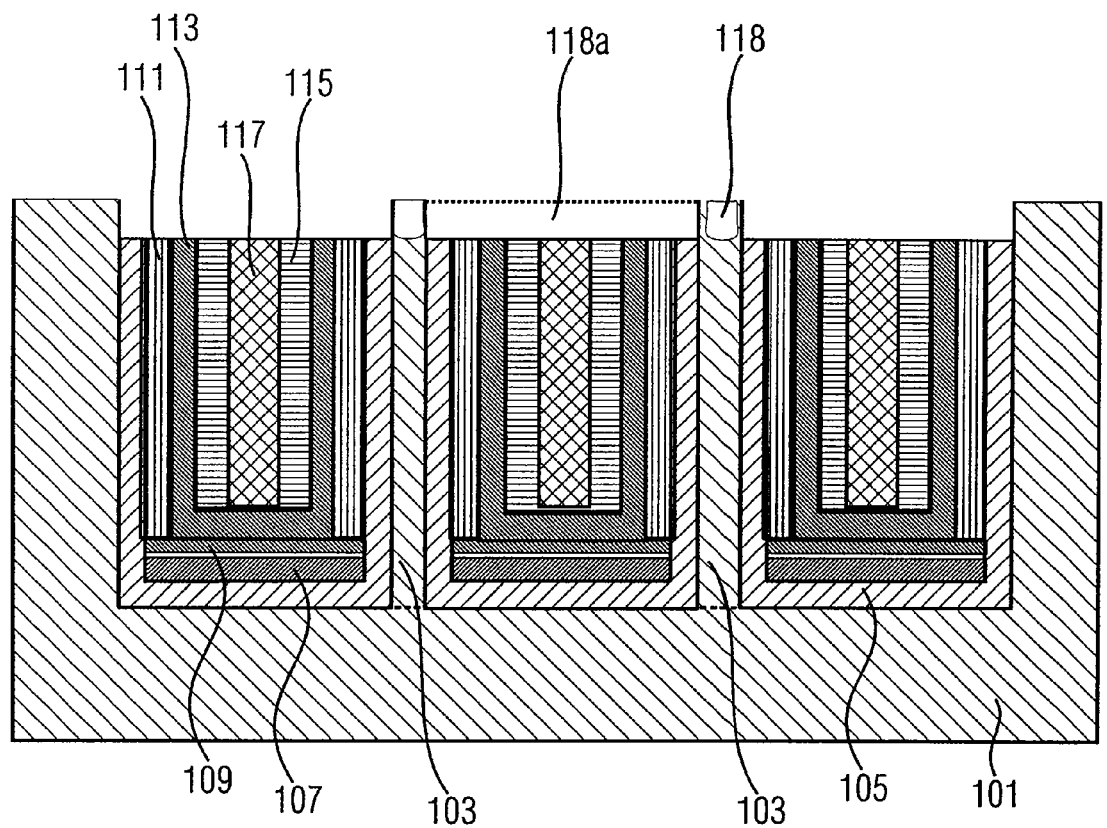
Figure 5H:
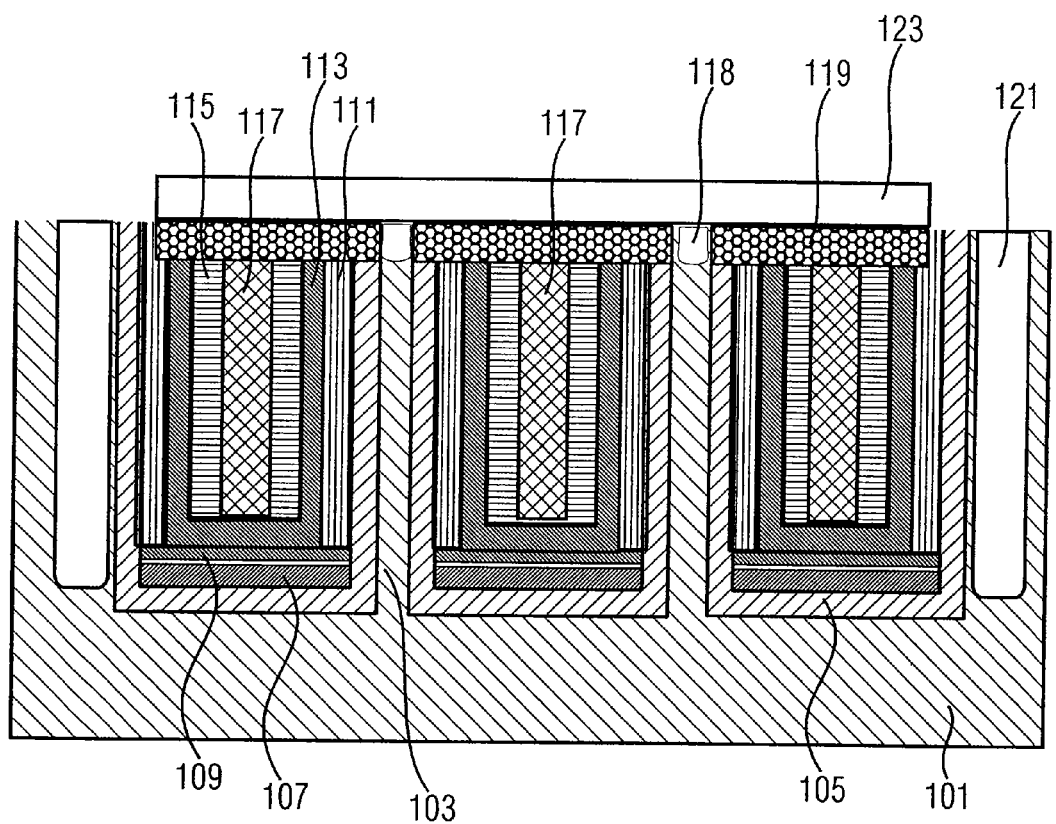

A contact for the memory cell is consecutively produced by forming an upper doped region 118, wherein the upper doped region 118 is formed in a domain of the protruding portion 103, of which the surface has been unsealed. Such a doped region can, for example, be an n-doped part of the protruding portion 103 and can be formed by a process of implantation, for example. The thus produced upper doped region 118 serves as a contact to be connected to a bit line which will be processed in a later step of the method of producing. Then a cavity or a recess 118a between the protruding portions 103 is produced. The production of the recess 118a is e.g. performed by a process of selective etching like a surface etching of the top surfaces of the layer 105, 111, 113 115 or the portion 117. The thus produced assembly is shown in FIG. 5g.

After this the cavities 118a are filled with an insulating material thereby producing a layer 119 of an insulating material. A substrate contact 121 or a plurality of substrate contacts 121 is then produced, for example, by photolithographically etching the substrate 101 and filling a thus formed trench with a conductive material or by implanting a dopant in the substrate 101. Finally a bit line 123 is then formed by means of patterned deposition or structuring, wherein, for example, a film of a conductive material is deposited or formed by a photolithographical process on a surface of the assembly. The bit line can also be produced by depositing a conductive material on the whole surface and partially removing portions of the deposited material by selective etching. The bit line 123 is formed such that it covers the insulating layer 119 and the upper doped regions 118 and borders on the upper doped regions 118, so that the upper doped region 118 is electrically contacted by the bit line 123.

In the memory cell 13 according to an embodiment of the present invention a diameter or a lateral extension of the protruding portion can be in a range from 100 nm to 7 µm. Apart from this, a depth or a vertical extension of the memory cell 13 can be in a range from 5 µm to 50 µm. However any dimensions of the memory cells 13 are alternatives.

In the memory cell arrays 11, 51, 91, the substrates 29, 79, 101 can comprise a semiconductor material, for example, silicon. However, any kind of material can be an alternative. The protruding portions 17 or the protruding strips 59a, 59b can be made of the same material as the substrate 17 or can be made of any kind of material.

In the memory cell arrays 11, 51, 91, the insulators 19, 23, the insulating layer 31 or the insulator strips 61, 65, 68 can be made of any insulating material, for example, silicon dioxide, silicon nitride or an oxide-nitride-oxide material. The floating gate 21, the floating gate region 63a, the wordline portions 25, 25a, the control element 33, 33a, 77 the wordline strips 55a, 55b, 57a, 57b, the bit lines 28, 67, 123 or the layers 107, 111, 115 can comprise any conductive material, e.g. a metal material or a polysilicon. Apart from this the floating gate 21 or the floating gate region 63a can comprise a conductive material for example a continuous portion of a conductive material or can comprise a continuous portion of an insulating material having islands or regions of a conductive material separated from each other by the insulating material, wherein the insulating material can have a nitride. The substrate contacts 29, 71, 121 can be implemented as a doped region of a substrate having a higher dopant concentration than a region of the substrate being positioned below the memory cell or can be implemented as a trench filled with a conductive material. However, any implementation of the substrate contacts 15, 71, 121 are alternatives hereto.

The control elements 33, 77 are arranged below the wordlines 25, 25a, 55a, 55b, 57a, 57b, so that the control elements 33, 33a, 77 are arranged between the wordlines 25, 25a, 55a, 55b, 57a, 57b and the substrate 29, 79, 101. However, any arrangements of the control elements 33, 33a, 77 in the memory cell array 11, 51, 91 are alternatives.

Apart from this, the control elements 33, 33a, 77 can be arranged such that they either control a current flow in a lateral direction parallel to a surface of the chip or that they control a current flow in a vertical direction perpendicular to the surface of the chip. However any other arrangements of the control elements 33, 33a, 77 even in a way that they can control a U-shaped current flow in the memory cell 13, 53, 93 are alternatives hereto.

In the method of producing shown in FIG. 4, the sequence of the steps can be changed in any way in order to produce a memory cell according to the present invention. The same applies to the method of producing outlined in the schematic views of FIGS. 5a-h.

The protruding portion 17, the first insulator 19, the floating gate 21, the second insulator 23 and the wordline portion 25, 25a are arranged in the memory cell 13, 13a such that they completely surround each other. However any arrangement, for example an arrangement in which two or more of the named regions only partially surround each other are alternatives hereto as long as long as the first insulator 19 is positioned near the wordline portion 25, 25a, the floating gate 21 is positioned near the wordline portion 25, 25a and the second insulator 23 is positioned between the sidewall of the protruding portion 17 and the floating gate 21.

In the memory cell array 11 depicted in FIG. 1B a surface of the insulating layer 31 facing the bit line 28 can be flush with a top surface or a surface of the upper region 17a facing the bit line 28. In an alternative embodiment of the memory cell array 11a lower surface of the insulating layer 31 or a surface facing away from the bit line 28 can be flush with the top surface of the upper region 17a. However any arrangements of the insulating layer 31 between the wordline 25 or the bitline 28 are alternatives.

In an alternative embodiment of the method of producing the memory cell array according to the present invention the producing of the recesses 118a could be omitted and the layer 119 of the insulating material could be produced by means of a patterned deposition. The insulating layer could be deposited for example on the top surfaces of the layer 105, 111, 113, 115 or the portion 117. The insulating layer could have openings in order to unseal the surface of the protruding portion 103, so that the upper doped regions 118 border on the openings or recesses in the layer 119 of the insulating material. After that the bit line 123 could be formed such that it covers the insulating layer 119 and the upper doped regions 118 and borders on the upper doped regions 118, so that the upper doped region 118 is electrically contacted by the bit line 123.

What is claimed is:

1. A memory cell, comprising:
    a substrate comprising a protruding portion, the protruding portion comprising a sidewall, a bottom, an upper doped region connected to a bit line and a lower region being closer to the bottom of the protruding portion than the upper region, and the protruding portion extending from a lower region of the substrate to the surface of the substrate;
    a substrate contact extending from a surface of the substrate into the substrate to the lower region of the substrate;
    a selection transistor having an active region configured to control a current flow between the lower region of the protruding portion and the substrate contact, wherein the active region extends in at least one of the lower region of the protruding portion and the lower region of the substrate; and
    a wordline portion, which is separated from the selection transistor, a first insulator near the wordline portion, a floating gate near the wordline portion and a second insulator between the floating gate and the side wall of the protruding portion, wherein the wordline portion, which acts as a control gate for the protruding portion, and the floating gate are arranged, so that a channel is generateable in the protruding portion near the side wall of the protruding portion between the upper doped region of the protruding portion and the lower region of the protruding portion.

2. The memory cell according to claim 1, wherein the protruding portion is essentially columnarly shaped.

3. The memory cell according to claim 1, wherein the protruding portion is surrounded by the side wall, the second insulator is surrounded by the floating gate, the floating gate is surrounded by the first insulator and the first insulator is surrounded by the wordline portion.

4. The memory cell according to claim 3, wherein the wordline portion is surrounded by an insulating region in order to separate the memory cell from an adjacent memory cell.

5. The memory cell according to claim 1, wherein the selection transistor and an element of a group of the wordline portion, the first insulator, the floating gate and the second insulator are arranged above each other, so that they overlap each other in a direction of sight vertical to the surface of a chip in which the memory cell is implemented.

6. The memory cell according to claim 1, wherein the wordline portion or the floating gate is arranged to control a current having a component vertical to the surface of the chip in which the memory cell is implemented and the selection transistor is arranged to control a current having a component parallel to the surface of the chip.

7. The memory cell according to claim 1, wherein the selection transistor comprises a control portion, the control portion and an element of the group of the wordline portion, the first insulator, the floating gate or the second insulator being arranged vertically above each other.

8. The memory cell according to claim 7, wherein the control portion on the one hand and the wordline portion, the first insulator, the floating gate and the second insulator on the other hand are arranged vertically above each other.

9. The memory cell according to claim 8, wherein the control portion comprises a conductive layer positioned between the wordline portion and the substrate, and the protruding portion extends across the control portion.

10. The memory cell according to claim 7, wherein the control portion is separated from the substrate by an insulating portion arranged between the control portion and the substrate, the insulating portion and the first insulator being formed by a continuous insulating layer.

11. The memory cell according to claim 7, wherein the wordline portion, the floating gate and the control portion are arranged, so that a channel generateable by the wordline portion, and the floating gate and a channel generateable by the control portion border on one another.

12. The memory cell according to claim 7, further comprising a third insulator arranged between the wordline portion and the control portion.

13. The memory cell according to claim 12, wherein the third insulator and the second insulator are formed by a continuous insulating layer.

14. The memory cell according to claim 1, wherein the wordline portion and the floating gate are arranged, so that a potential at the wordline portion or a density of charge carriers on the floating gate can control a density of charge carriers in the protruding portion.

15. The memory cell according to claim 1, wherein the bit line extends horizontally and overlaps with the floating gate, the wordline portion, the first insulator and the second insulator and is electrically separated from the wordline and the floating gate by an insulating region positioned between the bit line on the one hand and the floating gate and the wordline portion on the other hand.

16. The memory cell according to claim 1, wherein one element of the group of the wordline portion, the floating gate, the first insulator and the second insulator is positioned between the bit line and the selection transistor.

17. The memory cell array comprising a first memory cell according to claim 1 and a second memory cell according to claim 1, the first memory cell and the second memory cell positioned adjacently to each other, wherein the first memory cell and the second memory cell are separated by an insulating region.

18. The memory cell array according to claim 17, wherein the insulating region extends in a direction vertically to a surface of the chip in which the memory cell is implemented, so that the wordline portion of the first memory cell and the wordline portion of the second memory cell, both bordering on the insulating region, are electrically separated from each other by the insulating region.

19. The memory cell array according to claim 17, wherein the bit line extends from the first memory cell to the second memory cell and borders on the upper region of the protruding portion in the first memory cell and the upper region of the protruding portion in the second memory cell.

20. The memory cell array according to claim 17, wherein the selection transistor of the first memory cell comprises a first control portion and the selection transistor of the second memory cell comprises a second control portion, wherein the first control portion and the second control portion are implemented in a continuous layer of a conductive material extending from the first memory cell to the second memory cell.

21. The memory cell array according to claim 20, wherein a continuous portion of the substrate material extends from the substrate across the continuous layer of the control portion in the first memory cell and a continuous portion of the substrate material extends from the substrate across the continuous layer of the control portion in the second memory cell.

22. The memory cell array according to claim 20, wherein the first control portion in the first memory cell are separated from the substrate by its first insulating portion and the second control portion in the second memory cell is separated from the substrate by its first insulating portion, wherein the one insulating portion and the other insulating portion are implemented in a continuous layer of an insulating material extending from the first memory cell to the second memory cell.

23. The memory cell array according to claim 22, wherein the continuous layer of the insulating material extends along the side wall of the protruding portion in the first memory cell and along the side wall of the protruding portion in the second memory cell.

24. The memory cell array comprising a first memory cell according to claim 1, a second memory cell according to claim 1, a third memory cell according to claim 1 and a fourth memory cell according to claim 1;
wherein the four memory cells are arranged in a matrix configuration, the upper region of the first memory cell and the upper region of the second memory cell are connected by a first bit line, the upper region of the third memory cell and the upper region of the fourth memory cell are connected by a second bit line, and the first and the second bit lines are spaced apart from each other;
and wherein the wordline portion of the first memory cell and the wordline portion of the third memory cell are connected by a first conductor and the wordline portion of the second memory cell and the wordline portion of the fourth memory cell are connected by a second conductor, and the second conductor is spaced apart from the first conductor.

25. The memory cell array with a first memory cell according to claim 1 and a second memory cell according to claim 1, wherein the bit line extends from the first memory cell to the second memory cell and wherein the substrate contact comprises a portion of a conductive material being closer to the first memory cell than the second memory cell and extending from a surface of the substrate in which the memory cell array is implemented to a lower region of the substrate, the lower region being closer to the bottom of the first memory cell than the upper region, wherein the substrate contact is spaced apart from the bit line.

26. The memory cell array according to claim 25, wherein the wordline portion of the first memory cell is positioned between the portion of the conductive material and the wordline portion of the second memory cell.

27. The memory cell array comprising a first memory cell according to claim 1, a second memory cell according to claim 1, a third memory cell according to claim 1 and a fourth memory cell according to claim 1;
wherein the protruding portion of the first memory cell and the third memory cell are implemented in a first protruding strip of the substrate, the upper doped region of the first memory cell being connected to a first bit line and the upper doped region of the third memory cell being connected to the second bit line spaced apart from the first bit line;
wherein the protruding portion of the second memory cell and the protruding portion of the fourth memory cell are implemented in a second protruding strip of the substrate, the upper doped region of the second memory cell being connected to the first bit line and the upper doped region of the fourth memory cell being connected to the second bit line; and
wherein the wordline portion of the first memory cell and the wordline portion of the third memory cell are implemented in a first strip of a conductive material and the wordline portion of the second memory cell and the wordline portion of the fourth memory cell are implemented in a second strip of a conductive material, the first strip of the conductive material and the second strip of the conductive material being spaced apart from each other.

28. The memory cell array according to claim 27, wherein the first insulator of the first memory cell and the first insulator of the third memory cell are implemented in a first strip of an insulating material, the first strip of the insulating material being arranged between the first strip of the conductive material on the one hand and the floating gate of the first memory cell and the floating gate of the third memory cell on the other hand;
and wherein the first insulator of the second memory cell and the first insulator of the fourth memory cell are implemented in the second strip of an insulating material being arranged between the second strip of the conductive material on the one hand and the floating gate of the second memory cell and the floating gate of the fourth memory cell on the other hand.

29. The memory cell array according to claim 28, wherein the second insulator of the first memory cell and the second insulator of the third memory cell are implemented in a third strip of an insulating material, the third strip of the insulating material being arranged between the floating gate of the first memory cell and the floating gate of the third memory cell on the one hand and the first protruding strip of the substrate on the other hand; and
wherein the second insulator of the second memory cell and the second insulator of the fourth memory cell are implemented in a fourth strip of an insulating material, the fourth strip being arranged between the floating gate of the second memory cell and the floating gate of the fourth memory cell on the one hand and the second protruding strip of the substrate on the other hand.

30. The memory cell array according to claim 27 further comprising a strip-shaped portion of an insulating material, wherein the strip-shaped portion of an insulating material is arranged between the first strip of the conductive material and the second strip of the conductive material.

31. The memory cell array according to claim 27, wherein the first protruding strip of the substrate is arranged between the first strip of the conductive material and a further strip of a conductive material, and the first strip of the conductive material and the further strip of the conductive material are electrically connected to each other;
  wherein a further first insulator of the first memory cell and a further first insulator of the third memory cell are implemented in a first insulator strip;
  wherein a further second insulator of the first memory cell and a further second insulator of the third memory cell are implemented in a second insulator strip;
  wherein the second insulator strip is arranged between a further floating gate of the first memory cell and a further floating gate of the third memory cell on the one hand and the protruding strip on the other hand; and
  wherein the first insulator strip is arranged between the further strip of the conductive material on the one hand and the further floating gate of the first memory cell and the further floating gate of the third memory cell on the other hand.

32. The memory cell array according to claim 31, wherein a strip-shaped portion of an insulating material borders on the further strip of the conductive material and the second strip of the conductive material.

33. The memory cell according to claim 1, wherein the lower region of the substrate extends at least partially below the selection transistor, which is arranged adjacent to the bottom of the protruding portion.

34. The memory cell according to claim 1, wherein the wordline portion is electrically separated from the selection transistor.

35. Memory cell according to claim 1, wherein the substrate contact extends parallel to the protruding portion into the substrate to the lower region of the substrate.

36. A memory cell array, comprising:
  a first memory cell and a second memory cell, each memory cell implemented in a substrate comprising a first protruding portion protruding in a region of the first memory cell and a second protruding portion protruding in a region of the second memory cell, each protruding portion comprising a side wall and a bottom and extending from a lower region of the substrate to the surface of the substrate;
  a first upper doped region in the first protruding portion and a second upper doped region in the second protruding portion, the first upper doped region and the second upper doped region connected by a bit line;
  a first lower region being closer to the bottom of the first protruding portion than the upper region of the first protruding portion, and a second lower region being closer to the bottom of the second protruding portion than the upper region of the second protruding portion;
  a substrate contact comprising a portion of a conductive material extending from a surface of the substrate in which the memory cell array is implemented to a lower region of the substrate, the lower region being closer to the bottom of the first memory cell than the upper region, wherein the first memory cell is arranged between the substrate contact and the second memory cell;
  a selection transistor coupled between the first memory cell and the second memory cell, so that a current from the bit line to the substrate contact is controllable by the selection transistor, the selection transistor having an active region, wherein the active region extends in at least one of the lower region of the protruding portion and the lower region of the substrate;
  a wordline portion of the first memory cell, which is separated from the selection transistor, a first insulator of the first memory cell near the wordline portion of the first memory cell, a floating gate of the first memory cell near the wordline portion of the first memory cell and a second insulator of the first memory cell between the floating gate of the first memory cell and the side wall of the protruding portion in the first memory cell;
  wherein the wordline portion of the first memory cell, which acts as a control gate for the protruding portion, and the floating gate of the first memory cell are arranged, so that a channel is generateable in the substrate near the side wall in the protruding portion of the first memory cell between the upper region and the lower region of the protruding portion of the first memory cell;
  wherein the protruding portion of the first memory cell is surrounded by the second insulator of the first memory cell, the second insulator of the first memory cell is surrounded by the floating gate of the first memory cell, the floating gate of the first memory cell is surrounded by the first insulator of the first memory cell and the first insulator of the first memory cell is surrounded by the first wordline portion of the first memory cell;
  a wordline portion of the second memory cell, which is separated from the selection transistor, a first insulator of the second memory cell near the wordline portion of the second memory cell, a floating gate of the second memory cell near the wordline portion of the second memory cell and a second insulator of the second memory cell between the floating gate of the second memory cell and the side wall of the protruding portion in the second memory cell;
  wherein the wordline portion of the second memory cell, which acts as a control gate for the protruding portion, and the floating gate of the second memory cell are arranged, so that a channel is generateable in the substrate near the side wall in the protruding portion of the second memory cell between the upper region and the lower region of the protruding portion of the second memory cell;
  wherein the protruding portion of the second memory cell is surrounded by the second insulator of the second memory cell, the second insulator of the second memory cell is surrounded by the floating gate of the second memory cell, the floating gate of the second memory cell is surrounded by the first insulator of the second memory cell and the first insulator of the second memory cell is surrounded by the wordline portion of the second memory cell;
  a first insulating portion between the wordline portion of the first memory cell and the wordline portion of the second memory cell; and
  a second insulating portion between the substrate and the continuous layer of the conductive material, wherein the second insulating portion, the second insulator of the first memory cell and the second insulator of the second memory cell are implemented in a continuous layer of an insulating material.

37. A method for producing a memory cell, comprising:
  treating a surface of a substrate, so that a protruding portion of the substrate is formed, wherein the protruding portion extends from a lower region of the substrate to the surface of the substrate;

forming of an upper doped region in the protruding portion, wherein a lower region of the protruding portion is closer to the bottom of the protruding portion;

forming a substrate contact extending from a surface of the substrate into the substrate, and a selection transistor having an active region configured to control a current flow between the lower region of the protruding portion and the substrate contact, wherein the active region extends in at least one of the lower region of the protruding portion and the lower region of the substrate;

producing a wordline portion, which is separated from the selection transistor, a first insulator near the wordline, a floating gate near the wordline and a second insulator between the floating gate and a side wall of the protruding portion, so that the wordline portion, which acts as a control gate for the protruding portion, and the floating gate are arranged such that a channel is generateable in the protruding portion of the substrate near the side wall between the upper doped region of the protruding portion and the lower region of the protruding portion; and forming a bit line connected to the upper doped region of the protruding portion.

38. The method according to claim 37, further comprising forming an insulating layer on the first insulator, the second insulator, the floating gate or the wordline portion, wherein the insulating layer separates the floating gate and the wordline portion from the bit line.

* * * * *